United States Patent [19]

Roubal

[11] Patent Number: 4,666,739

[45] Date of Patent: May 19, 1987

[54] PROCESS FOR THE PRODUCTION OF METAL PATTERNS ON INSULATING SUBSTRATES AS WELL AS INSULATING SUBSTRATES WITH METAL PATTERNS, ESPECIALLY PRINTED CIRCUITS

[75] Inventor: Jiri Roubal, Bad Überkingen, Fed. Rep. of Germany

[73] Assignee: Dr.-Ing. Max Schlotter GmbH & Co. KG, Fed. Rep. of Germany

[21] Appl. No.: 731,163

[22] Filed: May 6, 1985

[30] Foreign Application Priority Data

May 11, 1984 [DE] Fed. Rep. of Germany ....... 3417563

[51] Int. Cl.$^4$ .......................... H05K 3/18; H05K 3/42
[52] U.S. Cl. .................................... 427/97; 204/14.1; 204/38.4; 427/98; 427/305; 427/306; 427/307; 430/315
[58] Field of Search ................... 427/97, 98, 307, 306, 427/305; 204/38.4, 14.1; 430/315

[56] References Cited

U.S. PATENT DOCUMENTS

| | | | |
|---|---|---|---|
| 4,039,714 | 8/1977 | Roubal | 427/307 |
| 4,285,991 | 8/1981 | Gedrat | 427/97 |
| 4,308,301 | 12/1981 | Huss | 427/307 |
| 4,325,780 | 4/1982 | Schulz | 427/97 |
| 4,520,046 | 5/1985 | McCaskie | 427/306 |

FOREIGN PATENT DOCUMENTS

| | | | |
|---|---|---|---|
| 0044878 | 2/1982 | European Pat. Off. | 427/98 |
| 3146164 | 5/1983 | Fed. Rep. of Germany | 427/304 |

*Primary Examiner*—John D. Smith
*Attorney, Agent, or Firm*—Hoffmann, Dilworth, Barrese & Baron

[57] ABSTRACT

A process is described for the production of metal patterns on insulating substrates, especially of printed circuits, in which the substrates are provided with holes by means of electrical connections and the metal patterns are produced on the surface of the substrate with the aid of a negative mask in accordance with the subtractive process, said process being characterized by the following steps:

treatment in gaseous sulfur trioxide;

application of a negative mask which corresponds to the conductive pattern to be produced;

through-hole-plating and subsequent plating of the conductive pattern, which is effected by the following steps in the process:

activation by means of an ionogenic precious metal solution, treatment in a reducing agent solution, chemical or chemical and electrolytic deposit, in which the metal deposit takes place solely on the surface of the metal pattern which is to be produced.

In addition, insulating substrates with metal patterns, especially printed circuits, are disclosed.

18 Claims, No Drawings

PROCESS FOR THE PRODUCTION OF METAL PATTERNS ON INSULATING SUBSTRATES AS WELL AS INSULATING SUBSTRATES WITH METAL PATTERNS, ESPECIALLY PRINTED CIRCUITS

The invention concerns a process for the production of metal patterns on insulating substrates, especially of printed circuits, in which these substrates are provided with holes for electrical connection and the metal patterns are produced on the surface of the substrate by means of a negative mask using the subtractive process. Further the invention comprises insulating substrates, especially printed circuits.

In the production of plated-through-hole printed circuit boards (pcbs) when using the subtractive process, the starting point is a laminate coated with metal foil. As the insulating material, use is made for example of glass fiber reinforced epoxide resin, phenol resin paper, epoxide resin paper, polyimide, PVC, inter alia.

The metal foils (usually copper foils) are applied on both sides of the laminate. Double-sided pcbs are produced from these insulating boards coated on both sides. If several layers of conductive patterns are pressed on each other, whereby a separation is caused by insulating substances, they are called multi-layer circuits (multi-layer boards). The through-hole-plating and production of the pcbs on the external surfaces of two- or multi-layer pcbs is effected on the same principle. After the manufacturing of the holes (openings) at the places where it is desired to form connections to the individual conductive patterns (e.g. by drilling, punching, milling et al.) and after a mechanical cleaning process of the metal film (e.g. by brushing), the through-hole-plating and the pattern plating are carried out in principle according to the following process sequence:

I. Throuqh-hole plating:
1. Cleaning of the pcb in an aqueous cleaner solution,
2. etching of the metal film,
3. activation,
4. chemical plating, preferably chemical copper-plating, and optionally
5. reinforcement (copper-plating) of the chemically deposited layer, if during step 4 above, only thin layers have been deposited.

II. Fabrication of the Negative Mask by means of Screen Printing or by Photoresist
6. Brushing of the boards,
7. coating, e.g. with photoresist and development of the negative conductor pattern or coating with screen print ink.

III. Pattern Plating:
8. Cleaning,
9. etching,
10. copper plating,
11. deposition of the etch resist, e.g. tin or lead-tin.

IV. Etching the pcbs:
12. Negative mask (photoresist or screen print ink) is removed,
13. etching of the metal not covered with etch resist (copper)
14. solder brightening, reflowing—if desired.

This is followed by coating with solder mask, component assembly and soldering.

This process is designated in the specialist field the "metal resist process".

The listed sequence of steps describes the principle of the above mentioned metal resist process. Every specialist recognizes at which point in the process sequence for example the rinsing processes must take place or at which point the boards must be placed on suitable devices (e.g. frames, baskets) to be able to transport them during the production. After some process steps, the process is interrupted; the boards can be stored for a certain period of time.

The step activation constitutes a process in which the metal nuclei are deposited on the walls of the holes in order to initiate the subsequent chemical metal deposit on the walls of the holes. The activation takes place in several process steps, such as for example:
pre-dipping
the actual activation in a solution which contains colloids on the tin-palladium basis,
conditioning (acceleration) e.g. in a $HBF_4$-solution.

In another activating process colloids on the basis of copper are used. This activation process is described in EP application No. 0 044 878.

Activations on the basis of metal colloids have certain disadvantages, as will be explained below. Ionogenic precious metal solutions, e.g. corresponding to DE-OS No. 2 116 389, can provide alternatives.

Another possibility in the production of plated-through-hole pcbs according to the subtractive process is the socalled tenting technique. In this process the sequence of process steps is the same in principle from 1 to 5, by comparison with the metal resist technique already described above. By the choice of the working conditions, in the process steps 4 and/or 5 the final layer thickness for the copper is attained. This is followed by:

II.a production of the positive mask by means of photoresist
6.a cleaning of the surface by brushing.
7.a coating with photoresist, development, whereby the photoresist forms a positive image.

III.a Etching, hot dip tinning
8.a etching, removal of the positive mask (photoresist)
9.a application of solder mask
10.a hot dip tinning.

For the sake of completeness the additive and the semiadditive processes for the production of pcbs should be mentioned. As the basic material uncladded laminates are used made of glass fiber reinforced epoxide resin, epoxide resin paper, or of phenol resin paper, which are coated with adhesive agents.

The above-mentioned process are part of the prior art and are described for example in the Handbuch der Leiterplattentechnik, Eugen Leuze Verlag, 1982.

By comparison with the other processes (tenting technique, additive, semi-additive processes) the metal resist process is the most widely used process for the production of plated-through-hole pcbs. This process is admissible from the point of view of technical practice, mature and is economic.

Nevertheless in the form in which it is used at present this process has a number of drawbacks:

The number of process steps is relatively large. The activation, especially the chemical metal deposition and the reinforcement (copper plating) in section I (through-hole plating), take place on the entire surface of the metal film.

On those places where no conductive tracks are provided, the metal deposit is in general senseless and it only means extra costs in the deposit, etching and effluent treatment.

The activation systems based on colloid solutions, despite certain improvements which have been achieved in recent years, are not very stable by comparison with the genuine "ionogenic" solutions, are sensitive to impurities, and are very costly because of the relatively complicated manufacturing process.

In step 4 (chemical metal deposition) chemical copper baths are used almost without exception. But with respect to the cost of the bath and its maintenance, a chemical nickel deposit would be more economical as against copper deposits. The costs for the treatment of the effluent of concentrates and rinse water which are contained in the chemical metallizing baths are not as high, especially for weakly acid nickel baths, as in the case of the alkaline copper baths used in practice, which contain strong complexing agents such as for example EDTA.

But the use of chemical nickel baths would have a serious disadvantage:

In the metal resist process etching solutions must be used which etch the copper at adequate speed, but which do not attack the metal resist (e.g. tin or lead-tin). Weakly alkaline etching solutions are suitable for this purpose. Nickel will be attacked in these etching solutions very slowly or not at all. The etching (process section IV, step 13) would be greatly disturbed or even impracticable. This means that the production of the conductive pattern would not be possible.

The process sections I and III of the metal resist technique are a series of various treatments in aqueous solutions. The pcbs are placed on a holder device (e.g. a frame) and are treated in accordance with the process cycle. The transport between the treatment baths is performed quickly, either manually or by means of an automatic installation.

The process section II represents an interruption of the process. The boards have to be removed from the holder device (frame). Although mechanical processing of the board (brushing) was effected before the through-hole-plating, this process step has to be repeated owing to the subsequent application of photoresist or screen print ink. After application of the negative mask, the boards are again placed e.g. on frames; then the further treatment is performed. The cleaning and the etching also have to be repeated. The etching at this point is especially critical, since the coating on the surface of the walls of the holes, which is still thin, can very easily be etched through. Corrosions of this type, even when they are only in places and thereby remain unnoticed, cause errors in the soldering process (the so-called "outgasing").

In order to exclude the interruption between the process sections I and III, the negative mask would have to be applied before the through-hole plating on the pcbs. This process variant would however involve insuperable difficulties. If the application of the negative mask is done before the activation, then not only the walls of the holes but simultaneously the negative mask will be activated when using the conventional activators. On the activated surfaces a metal deposit will be formed in the chemical metallizing bath. The inevitable result, i.e. covering the negative mask with metal, makes the production of the conductive pattern impossible.

It is the object of the current invention to make available a metal resist process which largely eliminates the existing drawbacks of the known methods, at least.

The inventive process of the type described above is characterized by the following process sequence:

1. treatment in gaseous sulfur trioxide,
2. application of a negative mask corresponding to the conductive pattern to be produced,
3. through-hole-plating and subsequent plating of the conductive pattern, realized by the following process steps:

activation by means of an ionogenic precious metal solution, treatment in a reducing agent solution, chemical or chemical and electrochemical deposition, whereby the activation and the metal deposition take place solely on the surface of the metal pattern to be produced.

This process has the following advantages against the formerly known processes:

the deposit takes place only on places where it is desired and expedient. Thereby savings are made in the metal deposition, the etching and the effluent treatment. The through-hole-plating does not have to be realized exclusively by chemical copper-plating. A chemical nickel-plating can also be used for this purpose. The process makes do with fewer process steps than the conventional processes.

The mechanical treatment of the boards (brushing) is only performed once. The cleaning and etching on the surface of the desired metal pattern before plating of the conductive pattern can be omitted. The danger of etching through the metal deposit on the walls of the holes is excluded.

Some of the process steps are known per se, e.g. in the plating of plastics etc. However the advantages which result from a combination of the known process steps in the sequence shown above are surprising.

The treatment in gaseous sulfur trioxide is among the known methods for the conditioning of non-conductors for the purpose of a subsequent metal deposition. This process is described in DE-PS No. 2 126 781.

Chromic acid and/or chromic acid/sulfuric acid solutions are also known conditioning agents for plastics. Sometimes the treatment in chromic acid-containing solutions is preceded by a treatment step in which the plastic surface is roughed or swollen to a certain extent. This treatment makes possible a useful reaction of the plastic in the solutions containing chromic acid with respect to the complete covering with metal during the chemical deposit and to the adhesive strength of the metal deposit on the surface of the plastic.

A process which refers especially to the production of pcbs is described in DE-OS No. 2 105 845. Using this process, epoxide resin laminates are first treated in an aqueous solution of dimethyl formamide and subsequently in a chromic acid/sulfuric acid-water mixture. The boards conditioned in this way are activated in a solution which contains colloids on the basis of tin-palladium. The conductive pattern is produced either by means of an additive or semi-additive process.

The conditioning agents based on chromic acid, with or without swelling, are not suitable for the process according to the invention. When using activations which can be employed for the process, whose composition and working conditions will be more fully explained below, no total metallization of the walls of the holes is achieved in the chemical metallization bath.

As has been disclosed in DE-OS No. 2 126 781, the process in which the plastic surface is treated with gaseous sulfur trioxide is an advantageous alternative to processes in which the plastic surface is conditioned with the aid of solutions containing chromic acid.

Both processes are composed—like other processes for the plating of plastics—of the following process steps.
1. Conditioning,
2. activation with precious metal salt or
2a. sensibilization in solutions which contain salts of tin(II) followed by activation in the precious metal salt solutions,
3. treatment in a reducing agent solution,
4. chemical metallization.

It is by no means clear from DE-PS No. 2 126 781 that the conditioning in gaseous sulfur trioxide is suitable for the production of metal patterns on insulating substrates using the subtractive process. The examples 19 to 22 of this patent describe possibilities for the production of pcbs according to the semi-additive or additive processes. The process cycle according to the invention is neither mentioned nor suggested in any way in this patent.

The process cycle according to the invention has basic differences from the process according to the DE-PS No. 2 126 781. In the process according to DE-PS No. 2 126 781 the plastics are activated directly after the treatment in gaseous sulfur trioxide. The palladium solutions used for the activation are certainly usable for the process as in the invention, but they are not advantageous as will be explained later. Activation on the basis of treatment in tin- and then in palladium-solutions is not usable, because not only the walls of the holes of the insulating boards but also the negative mask are activated and thereby are subsequently metallized. It has been found to be especially surprising that interruptions and intermediate treatments are possible before the activation according to the invention. It is not obvious to the specialist that plastic surface which reacts sensitively after the conditioning can be dried repeatedly without difficulties and exposed to the effects of various solutions such as developer solutions for photoresist, cleaning solutions containing wetting agents and the oxidizing solutions for the etching of the metal film before the process step of activation, without thereby losing the capacity for the usable acceptance of the precious metal. The expert would rather have believed that the interruption of the process and the application of the negative mask should be effected only after the precious metal nuclei have been fixed on the surface, i.e. after the process step of activation and of treatment in a reducing agent solution, directly before the chemical metallization. But it has been found that this variant of the process does not lead to a complete covering of the walls of the holes with metal, i.e. no proper through-hole-plating results.

The measures for the use of gaseous sulfur trioxide for the pretreatment of plastics are known from DE-PS No. 2 126 781, and they apply in principle also to the process according to the invention. The adhesion of the metal deposit on the walls of the holes is assisted by the roughing of the walls of the holes during the production of the holes (drilling). Because of these already existing structures of the surface favorable for adhesion, in the choice of the treatment conditions still larger tolerance ranges are available, by comparison with those cases in which plastics with smooth surfaces are to be plated.

For the majority of plastics concentrations used range from the area of 10 mg/l $SO_3$ up to an $SO_3$ concentration which corresponds to the vapor pressure over 65% oleum at 25° C. The duration of the treatment is chosen from the range between 1 second to 20 minutes, preferably from 10 seconds to 5 minutes.

The application of the negative mask using e.g. screen print ink, photo coating or photo-resist film is a known process when viewed in isolation and does not require any further explanation.

After the production of the negative mask, i.e. before the activation, the boards are cleaned in aqueous solutions. The cleaning can be done for this purpose in the usual trade cleaning agents. These cleaning agents react depending on their type either acid or alkaline and they contain acids such as phosphoric acid, sulfuric acid, or in another case alkalis, and further inorganic neutral salts, various organic compounds and especially wetting agents. It is understandable that when using alkali-soluble photoresists only the acidly reacting cleaning agents can be employed. Some cleaning agents contain substances which could strongly impede the chemical metal deposition, the so-called catalytic poisons. For example this group includes thio-urea. Understandably the use of such substances in these cleaning agents should be avoided in order not to disturb the subsequent chemical metallization.

For the etching of the metal foil (which in most cases is copper foil), the conventional etching agents are used based on persulfates or on hydrogen peroxide.

In principle solutions of the precious metal salts can be used for the process according to the invention; this is followed by treatment in a reducing agent solution; activating systems which work with metal colloids or systems in which the boards are first sensitized in tin (II) salts and are then activated in solutions of precious metal salts cannot be used owing to their simultaneous effect on the surface of the walls of the holes and on the negative mask.

Solutions of precious metal salts tend to hydrolyze. To prevent hydrolysis, the pH value is adjusted by the addition of acids to lower values. From precious metal solutions, especially from acidic solutions, in which the precious metal ion is present in non-complex form, the precious metal is deposited on the surfaces of nonprecious metals by ion exchange. The ionogenic precious metal solutions, which are used for the activation of the non-conductors for the subsequent metal deposition such as has been described in DE-PS No. 2 126 781, have this disadvantage. In the conventional plating of non-conductors this drawback plays no part, since only the non-conductor surfaces are treated. In the subtractive process simultaneously the non-conductor and the metal (copper foil) are treated. The metal deposition is effected by ion exchange.

Measures which lead to the prevention of cementation on non-precious metals are known. At the electrodeposition of palladium this is prevented for example by raising the pH value and by the addition of chelating agents such as for example ammonium salts. This doctrine can for example be inferred from Metal Finishing Guidebook, pages 357–359, Metals and Plastics Publications Inc., 381 Broadway, Westwood, N.J., USA (1962) or from the Handbuch der Galvanotechnik vol. II, page 428, Carl Hanser Verlag, Munich 1966.

Apart from electrochemical and chemical palladium baths, applications of compounds containing nitrogen in activating solutions are known from DE-PS No. 1 621 207 and from DE-OS No. 2 116 389. According to the DE-PS a process is claimed in which the plastic surfaces are first sensitized in tin (II) salt solutions, then activated in palladium salt solutions, which contain in addition a compound containing nitrogen. The pH value of this solution is set so that no palladium is cementively deposited on the copper, yet a reaction takes place between tin (II) compounds and the palladium on the surface. DE-PS No. 1 621 207 makes use of the fact known at the time of the application for this invention that palladium cementation is prevented by the addition of compounds which contain nitrogen. By the addition of compounds containing nitrogen, the activity of the palladium ion with respect to activation is reduced. According to DE-PS No. 1 621 207 working ranges have been found in which the activation with palladium salt solutions containing compounds which contain nitrogen is possible after the sensitization. This publication cites as an embodiment the known through-hole-plating-process with this modified activator system. These activation systems are not usable for the process according to the current invention because of the possible metallization of the negative mask, as described above.

In the process according to DE-OS No. 2 116 389, the plastic surface is activated in a solution of precious metal salts which additionally contains a compound containing nitrogen, then is treated in a solution of for example dimethylaminoborane or sodiumhypophosphite for the reduction of the precious metal and is finally metallized in a chemical copper bath. In the specification of DE-OS No. 2 116 389 it is specially mentioned that this activation is suitable for the production of plated-through-hole pcbs according to the known process, whereby the entire surface of the copper foil is activated and chemically metallized.

The functional capability of the activating solution is greatly dependent on the pH value, according to DE-OS No. 2 116 389. Further there are differences between the individual compounds containing nitrogen with respect to activation. The use of 2-aminopyridine is for example more favorable than the use of ammonia or ammonium salt.

According to the examples in DE-OS No. 2 116 389 a compound containing nitrogen is added to the precious metal salt and the pH value is then raised to about 7. These solutions cannot be used for the process as in the invention, because metal is deposited, according to the influence of such activation solutions in the chemical metallizing bath, not only on the walls of the holes but also on the surface of the negative mask, as is shown in example no. 14.

The activation solutions which are usable and/or preferable for the present invention should, where possible, simultaneously meet the following requirements:
1. Adequate coating with precious metal, with respect to the complete metallization of the walls of the holes (non-metal) must be guaranteed.
2. The cementation of the precious metal on the metal film (copper) should not take place at all or only to a slight extent.
3. The negative mask must not be activated.

In the cited patent literature, processes are described in which an adequate activation of non-conductors (plastics) takes place with a simultaneous prevention of precious metal cementing on the base metals (e.g. copper). However the effect with respect to the non-conductor is undesirable in the case of the present invention, because otherwise the negative mask (non-conductor) will be metallized.

It has been found that precious metal solutions which contain compounds of basic nitrogen can meet all the above-named conditions under certain working conditions (i.e. concentrations and pH value). As the nitrogen-containing compounds, ammonia, primary, secondary and tertiary amines and other compounds which contain the basic nitrogen, as well as the salts of these compounds, are used. The following examples are named: ethylamine, butylamine, ethylenediamine, pyridine, urea, ethylhexylamine, taurine, glycine. These compounds can be used e.g. as sulfates, chlorides or nitrates.

The usable concentration of the nitrogen-containing compound is dependent on the palladium concentration. The ratio of the molar concentration, based on the amino groups, to the molar concentration of the palladium ion should be at least 2. The pH value of the solution is set at between 1 and 7, preferably between 2 and 3.

To the expert it is understandable that the type of the compound containing nitrogen, the concentrations of the palladium and of the nitrogen-containing compound as well as the pH value will influence the usefulness of the activation in the process according to the present invention.

Ammonia and the ammonium salts are weaker chelating agents for the palladium ion than for example ethylenediamine. For binding the palladium deposit on copper, smaller concentrations of ethylenediamine are required than when using ammonia. On the other hand, the activations with respect to the complete coverage of the walls of the holes in the chemical metal deposition bath are not very sensitive to higher concentrations of ammonia. Overdoses of the strong chelating agent (ethylenediamine) may reduce the effect of the palladium below a usable extent and thereby may prevent the complete coverage of the non-conductor.

The working conditions (concentrations and pH value) have a reciprocal influence on the usefulness of the activating solution. The most favorable working range of the activation can be found by a few tests without difficulty:

After the dissolution of the palladium salt the compound containing the nitrogen is added, and the pH value is set to e.g. from 2 to 3. Then as is described below, tests are conducted in which optionally the conditions are varied in the direction of the desired result:
1. Testing of the palladium cementing on the metal film (copper). Cementation is reduced by an increase in the pH value and/or by raising the concentration of the compound containing nitrogen.
2. Testing of the coverage of the walls of the holes in the chemical metallizing bath, wherein the drilled boards are conditioned in gaseous sulfur trioxide and are then cleaned, etched and activated in the available activating solution.

A lower concentration of the compound which contains nitrogen and/or a higher palladium concentration improve the result during the chemical metal deposition.
3. Testing of the coverage of the negative mask. The sample is treated as described under 2., but conditioning is not effected. In principle this test corresponds to the process as in DE-OS No. 2 116 389 or DE-PS No. 1 621 207. With respect to these publications a negative result should be obtained at this point:

The covering of the non-conductor (negative mask) must not occur. This is optionally attainable by the reduction of the pH value in most cases.

The tests can be carried out separately (three separate samples) or can be performed on a drilled sample which has been conditioned in sulfur trioxide and then with a sample coated with a negative mask simultaneously.

Examples 6 and 7 demonstrate the action taken during the testing.

The temperature at which the activating solution is used is not critical. Understandably the activation is applied at room temperature, but higher as well as lower temperatures are admissible. A duration of influence of from 20 seconds to 10 minutes, preferably from 1 to 3 minutes, is enough.

After activation, treatment is performed in a reducing agent solution such as in a solution of dimethylaminoborane. The pH value of this solution is preferably adjusted to be weakly acidic (e.g. pH=5), in order to exclude the attack on the alkali soluble resist.

The chemical metal deposition can be done in a chemical copper bath or a chemical nickel bath. Alkaline chemical copper baths are not suitable when using alkali-soluble resists. To make possible the universal use of the process, preferably weakly acid chemical nickel baths should be used.

The chemical nickel baths which are normal in the trade and are used in practice contain nickel salts, chelating agents (usually organic acids and their salts), reducing agents (usually sodium hypophosphite or aminoboranes) and stabilizers (e.g. compounds of bivalent sulfur or heavy metals). These baths can be used without limitations in principle. Preferably use is made of baths which contain aminoborane compounds alone or with sodium hypophosphite as the reducing agent. These baths can work at relatively low temperatures (up to 50° C.). Thereby the possible temperature load on the negative mask is kept low and the possible resultant, too strong extension of the negative mask, associated with bubble formation, flaking inter alia, is largely avoided.

The further build-up of the conductor pattern is done by conventional methods. Usually at this point there follows galvanic copper deposit in acidic baths as well as deposit of the metal etch resist (e.g. tin, lead-tin, nickel, gold inter alia). A chemical deposit e.g. in a chemical copper bath is possible in principle when suitable (alkali resistant) negative masks are used.

The following examples show possible applications of the process, without thereby limiting the invention to such examples.

The comparative examples relate to the explanations given above.

EXAMPLE 1

A printed circuit was produced from a copper-cladded epoxide resin laminate. The sequence of treatment was:
1. Drilling the board;
2. treatment in an atmosphere containing $SO_3$ which was in equilibrium with oleum (35% by weight) at room temperature for 20 seconds;
3. rinsing in water;
4. drying the board;
5. brushing the board, coating with an alkali-soluble photoresist film obtainable in the trade, production of a negative mask;
6. placing the board on a frame;
7. cleaning the board in a normal trade acid cleaner, for 5 minutes at room temperature;
8. rinsing in water;
9. etching in a sodium persulfate solution for 2 minutes at room temperature;
10. rinsing in water;
11. activation in a solution of the following composition:
    palladium (as palladium nitrate): 200 mg/l
    sulfuric acid, concentrated: 20 g/l
    ammonia solution, concentrated: 25 g/l
    set to pH 2.6.
    The treatment was performed for two minutes at room temperature;
12. rinsing in water;
13. treatment in a dimethylaminoborane solution (1g/l) pH 5.5 for 1 minute at room temperature;
14. rinsing in water;
15. chemical nickel-plating at 45° C. for 15 minutes. The chemical nickel bath has the following composition:
    nickel as nickel sulfate: 7 g/l
    lactic acid: 30 g/l
    sodium hypophosphite: 10 g/l
    dimethylaminoborane: 2 g/l
    lead (as acetate): 0.3 mg/l
    pH of the bath (adjusted with sodium hydroxide) 5.5;
16. rinsing in water;
17. dipping in a 5% sulfuric acid for 20 seconds at room temperature;
18. galvanic copper-plating in normal trade sulfuric acid copper bath; layer thickness is 25 $\mu$m;
19. rinsing in water;
20. dipping in acid;
21. deposition of the lead-tin coating from a normal trade lead-tin bath;
22. rinsing in water and drying the board;
23. removal of board from the frame;
24. removal of the photoresist film, etching of the residual exposed copper film.

The pcb was optically evaluated under a binocular microscope. No defects (through-hole-plating, contours of the conductor track) were observed.

EXAMPLE 2

Four copper-clad drilled laminates made of glass fiber reinforced epoxide resin were treated analogously to example 1. The conditions when treating them in an atmosphere containing sulfur trioxide were:
1. $SO_3$ concentration in oleum: 35%
   duration of treatment: 20 seconds
2. $SO_3$ concentration in oleum: 35%
   treatment duration: 40 sec.
3. $SO_3$ concentration in oleum: 42%
   treatment duration: 20 sec.
4. $SO_3$ concentration in oleum: 50%
   treatment duration: 20 sec.

During the galvanic copper deposition (step 18) a 5 $\mu$m thick coating was deposited.

An optical test of the pcbs showed faultless through-hole-plating and a faultless conductor pattern plating.

EXAMPLE 3

Analogously to example 2 a copper-clad PVC film and a board of copper-clad apoxide resin paper were treated. The production of the holes was done by punching, the negative mask was produced by screen printing color. The conditions during treatment in gaseous sulfur trioxide were:

for PVC
  oleum concentration: 65% SO₃
  treatment duration: 10 sec.
for epoxide resin paper:
  oleum concentration: 35% SO₃
  treatment duration: 20 sec.

After the copper deposition (layer thickness 5 μm) the through-hole-plating was checked. The result was faultless.

EXAMPLE 4

A drilled copper-clad epoxide resin laminate was treated analogously to example 1 above. In step 9, etching, a normal trade etching solution on the basis of hydrogen peroxide was used at 50° C. for a period of two minutes. The through-hole-plating and the conductor pattern plating were faultless.

EXAMPLE 5

Copper-clad glass fiber reinforced epoxide resin laminates were treated anologously to example 1. In the treatment step 11 (activation) various activator solutions were used. The treatment in the activator solutions lasted 3 minutes in each case and was carried out at room temperature. The compositions of the solution were as follows:

Activator solution no. 1

Palladium (as palladium nitrate): 200 mg/l
sulfuric acid, concentrated: 20 g/l
pyridine: 32 g/l
pH value: 2.7

Activator solution no. 2

Palladium (as palladium nitrate): 200 mg/l
sulfuric acid, concentrated: 20 g/l
ethanolamine: 24 g/l
pH value (adjusted using ethanolamine): 2.1

Activator solution no. 3

Palladium (as palladium nitrate): 200 mg/l
sulfuric acid, concentrated: 20 g/l
butylamine: 30 g/l pH value (adjusted with butylamine): 2.0

Activator solution no. 4

Palladium (as palladium dichloride): 200 mg/l
sulfuric acid, concentrated: 10 g/l
ammonium chloride: 2.4 g/l
pH value (adjusted using ammonia): 2.6

Activator solution no. 5

Palladium (as palladium nitrate): 200 mg/l
nitric acid, concentrated: 40 g/l
pH value (adjusted using ammonia): 2.7

During the treatment in the above-mentioned palladium solutions, no perceptible cementation of palladium on the copper backing was observed. The through-hole-plating and the state of the negative mask were checked after a deposition of 5 μm. The through-hole-plating was faultless, the negative mask remained uncovered, and the contours of the conductive tracks were faultless too.

EXAMPLE 6

Analogously to example 1, a copper-clad and drilled epoxide resin laminate was treated. During the treatment step no. 11, an activation on the basis of palladium and ethylamine was used. The palladium concentration was 200 mg/l. The amount of sulfuric acid corresponded approximately stoichiometrically to the added amount of ethylamine. With ethylamine concentrations of 17.9 g/l (the pH of the solution was 2.0) a palladium cementation which was noticeable with the naked eye was found on the copper foil. Nevertheless, the through-hole-plating and the adhesive strength of the electrochemically deposited copper layer was faultless. An increase of the pH value of the activation to 3.1 produced a clear reduction of the palladium cementation on the copper foil. The through-hole-plating was faultless. Then sulfuric acid was added to this solution and the pH value was adjusted, using ethylamine, to 3.2. The concentration of ethylamine was 38 g/l at that time. In this case too the through-hole-plating was faultless, while there was no coverage of the negative mask with metal.

EXAMPLE 7

Analogously to example 6, activator solutions on the basis of glycine or ethylene diamine were made up. With the concentrations chosen initially of the chelating agent and of the palladium and of the pH value of the activation solution, unsatisfactory results were observed. By changing the concentrations and the pH value, usable working conditions were established. The tables below show how the modifications took place one after another and also the results of the tests.

The compositions of the solutions were:
palladium (as palladium nitrate): for concentration see the table
sulfuric acid, concentrated: 10 g/l
chelating agent: see table
pH value (optionally adjusted using NaOH): see table.

| Palladium Concentration (mg/l) | Glycine concentration (g/l) | pH value | Through-hole-plating | Palladium Cementation | State of the Negative Mask |
|---|---|---|---|---|---|
| 200 | 2.5 | 1.0 | incomplete | none perceptible | not determined |
| 200 | 20.0 | 1.9 | none | none perceptible | not determined |
| 200 | 0.25 | 2.1 | incomplete | none perceptible | not determined |
| 300 | 0.20 | 3.0 | faultless | visible | not determined |
| 200 | 0.15 | 2.9 | faultless | not perceptible | faultless |
| 100 | 0.075 | 2.0 | faultless | not perceptible | faultless |
| 100 | 0.075 | 3.0 | faultless | not perceptible | faultless |

-continued

| Palladium Concentration (mg/l) | Ethylene diamine concentration (g/l) | pH value | Through-hole-plating | Palladium Cementation | State of the Negative Mask |
|---|---|---|---|---|---|
| 200 | 6.2 | 1.2 | none | none perceptible | not determined |
| 200 | 1.2 | 1.0 | incomplete | visible | not determined |
| 200 | 1.2 | 2.0 | incomplete | none perceptible | not determined |
| 200 | 0.12 | 2.0 | faultless | none perceptible | faultless |
| 200 | 0.24 | 2.0 | faultless | none perceptible | faultless |
| 200 | 0.60 | 2.0 | incomplete | none perceptible | faultless |

EXAMPLE 8

In analogy to example 1, drilled copper-clad epoxide resin laminate were treated. The composition of the chemical nickel baths as well as the conditions for the nickel-plating (process step no. 15) were varied.

Chemical Nickel Bath no. 1

As listed in example 1.

Chemical Nickel Bath no. 2 nickel (as nickel sulfate): 6 g/l
malic acid: 30 g/l
succinic acid: 10 g/l
dimethylaminoborane: 2 g/l
lead (as acetate): 0.3 mg/l
pH (adjusted with sodium hydroxide): 5.5
temperature: 50° C.
treatment duration: 15 minutes

Chemical Nickel Bath no. 3

Is analogous to the chemical nickel bath no. 2 but instead of lead thiourea (0.2 mg/l) was used.

When using all these three chemical nickel baths impeccable through-hole-plating was observed.

EXAMPLE 9

This example shows the use of solvent-soluble resist and a chemical copper bath.

In analogy to example 1, in process step no. 5 the negative mask was produced using a solvent soluble photo resist. The chemical metal deposition (process step no. 15) was performed in a usual chemical copper bath as is obtainable from the trade. The through-hole-plating and the state of the negative mask were checked after the galvanic copper-plating and were found to be impeccable.

EXAMPLE 10

According to the process sequence as shown in example 1, 20 boards were produced for a soldering test. The conditions during the treatment in gaseous sulfur trioxide were varied in accordance with example 2. After the process step no. 24, the pcbs were reflowed. All the pcbs passed the soldering test without any defects.

EXAMPLE 11 (COMPARATIVE EXAMPLE)

A drilled copper-backed board made of epoxide resin laminate was coated with photo-resist. After the production of the negative mask, the usual through-hole-plating was carried out. The individual treatment steps were as follows:
1. Cleaning of the boards in a normal trade acid cleaner;
2. rinsing in water;
3. etching of the board in sodium persulfate solution;
4. rinsing in water;
5. activation in an activating system on the basis of palladium-colloid, wherein the individual process steps for the activation were:
   (a) pre-dipping;
   (b) treatment in palladium colloid;
   (c) rinsing;
   (d) acceleration;
   (e) rinsing.
6. Chemical metallization in a chemical nickel bath.

The chemical nickel bath had the same composition as listed in example 1. The through-hole-plating was faultless. The negative mask was about half covered with metal. The result was that the board was useless.

EXAMPLE 12 (COMPARATIVE EXAMPLE)

A drilled copper-clad epoxide resin laminate was treated for five minutes in an aqueous dimethyl formamide solution (1:1) at room temperature and then washed in water. This was followed by a treatment in a chromic acid/sulfuric acid-water mixture which had the following composition:
chromic acid: 10% by weight
sulfuric acid: 50% by weight
water: 40% by weight The treatment lasted for five minutes at room temperature. Corresponding to example 1 the board was activated and was chemically nickel-plated, i.e. in detail the board was treated in accordance with the process steps no. 6 to 16 as shown in example 1.

After a copper-plating it was clear that the holes remained uncovered, and thus the board had not been through-hole-plated.

EXAMPLE 13 (COMPARATIVE EXAMPLE)

This example refers to a change in the sequence of the process. A drilled copper-backed board was treated as is described below:
1. treatment in an atmosphere containing $SO_3$ as shown in example 1;
2. rinsing in water;
3. activation in analogy to the steps 11 to 14 of the example 1;
4. drying of the board, interruption of the treatment sequence.

The production of the negative mask, which otherwise would have followed at this point, was omitted.
5. Continuation of the treatment: cleaning, etching, treatment in the chemical nickel bath and in the electrochemical copper bath in analogy to example 1, steps no. 7 to 10 and 15 to 18.

Result: no complete through-hole-plating was observed.

EXAMPLE 14 (COMPARATIVE EXAMPLE)

In analogy to example 5, an activating solution of 200 mg/l palladium was tested with 2 aminopyridine (0.95 g/l). The pH value was varied. The treatment in gaseous sulfur trioxide was omitted with some of the samples. The results are shown in the table below.

| SO₃ treatment yes: + no: − | pH value of activation | Through-hole-plating | palladium cementation | coverage of the negative mask |
|---|---|---|---|---|
| + | 1.0 | faultless | none | none |
| + | 3.0 | faultless | none | none |
| + | 5.0 | faultless | none | covered |
| + | 7.1 | faultless | none | covered |
| + | 9.1 | faultless | none | covered |
| − | 1.0 | defective | none | none |
| − | 3.0 | defective | none | none |
| − | 5.0 | defective | none | covered |
| − | 7.1 | faultless | none | covered |
| − | 9.1 | faultless | none | covered |

What I claim is:

1. A process for the production of metal patterns on a metal-clad insulating substrate in which said substrate is provided with holes for electrical connection and the metal patterns are produced on the surface of said substrate with the aid of a negative mask according to the substractive process, said process comprising the steps of:
   (i) treating said substrate with gaseous sulfur trioxide;
   (ii) applying a negative mask to the sulfur trioxide treated substrate, said negative mask corresponding to the negative image of the conductive pattern to be produced;
   (iii) activating said substrate by treatment with an ionogenic palladium activating solution having a pH in the range of from 1 to 7;
   (iv) treating said substrate with a reducing agent solution; and
   (v) chemically or chemically and electrochemically depositing metal on said substrate, said metal being selectively deposited on the surface of the metal pattern to be produced and on the walls of said holes provided for electrical connection.

2. Process as in claim 1, wherein during the treatment sulfur trioxide in concentrations of 10 mg/l up to concentrations which correspond to the vapor pressure of sulfur trioxide over 65% oleum at 25° C. is used.

3. Process as in claim 1, wherein the treatment in gaseous sulfur trioxide lasts from 1 second to 20 minutes.

4. Process as in claim 1, wherein the negative mask is produced by means of photoresist or by screen printing.

5. Process as in claim 1, wherein one or more compounds which contain basic nitrogen are added to said activating solution.

6. Process as in claim 5, wherein the ratio of the molar concentration of the compound containing nitrogen, based on nitrogen, to the molar concentration of the palladium salt is at least 2.

7. Process as in claim 5, wherein the activating solution contains ammonium ions.

8. Process as in claim 5, wherein the activating solution contains primary, secondary or tertiary amines.

9. Process as in claim 5, wherein the pH value of the activating solution is adjusted to be from 2 to 3.

10. Process as in claim 1, wherein the reducing agent solution contains aminoborane compounds.

11. Process as in claim 10, wherein the reducing agent solution contains dimethylaminoborane.

12. Process as in claim 1, wherein as the negative mask, solvent soluble or alkali soluble photoresists or screen printing inks are used.

13. Process as in claim 1, wherein as the chemical deposition bath, a chemical nickel bath is used.

14. Process as in claim 13, wherein the chemical nickel bath contains aminoborane as the reducing agent.

15. Process as in claim 13, wherein the chemical nickel bath contains dimethylaminoborane.

16. Process as in claim 13, wherein the pH value of the chemical nickel bath is set between 5 and 7.

17. Process as in claim 1 wherein said metal-clad insulating substrate is a printed circuit board.

18. Process as in claim 1, wherein the treatment in gaseous sulfur trioxide lasts from 5 seconds to 5 minutes.

* * * * *